US012710495B2

(12) United States Patent
Findeklee et al.

(10) Patent No.: US 12,710,495 B2
(45) Date of Patent: Aug. 18, 2026

(54) RADIO FREQUENCY COIL ASSEMBLY WITH SIGNAL ADJUSTMENT CIRCUIT, RELATED METHOD AND COMPUTER PROGRAM PRODUCT

(71) Applicant: KONINKLIJKE PHILIPS N.V., Eindhoven (NL)

(72) Inventors: Christian Findeklee, Norderstedt (DE); Christopher Günther Leussler, Hamburg (DE); Peter Vernickel, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 152 days.

(21) Appl. No.: 18/850,616

(22) PCT Filed: Mar. 22, 2023

(86) PCT No.: PCT/EP2023/057374
§ 371 (c)(1),
(2) Date: Sep. 25, 2024

(87) PCT Pub. No.: WO2023/186668
PCT Pub. Date: Oct. 5, 2023

(65) Prior Publication Data

US 2025/0102602 A1 Mar. 27, 2025

(30) Foreign Application Priority Data

Mar. 31, 2022 (EP) .................................... 22165733

(51) Int. Cl.
*G01R 33/36* (2006.01)

(52) U.S. Cl.
CPC ..... *G01R 33/3685* (2013.01); *G01R 33/3628* (2013.01)

(58) Field of Classification Search
CPC . G01R 33/3685; G01R 33/3628; G01R 33/36
See application file for complete search history.

(56) References Cited

U.S. PATENT DOCUMENTS 9,407,268 B1 8/2016 Hsu
11,112,470 B1 9/2021 Hamamura
(Continued)

FOREIGN PATENT DOCUMENTS

CN 204481788 U 4/2015

OTHER PUBLICATIONS

International Search Report and Written Opinion from PCT/EP2023/057374 mailed Jun. 5, 2023.
(Continued)

*Primary Examiner* — G.M. A Hyder

(57) ABSTRACT

In the case of a radio frequency (RF) coil assembly for a magnetic resonance (MR) imaging system, interference in a galvanic transmission line (1) configured to transmit a digital signal should be avoided. This is achieved in that a signal circuit (Pr2) is provided, configured to monitor non-differential asymmetries around the Larmor frequency in a signal through the galvanic transmission line (1), wherein the signal circuit (Pr2) is configured to provide feedback to a digital adjustment circuit (4), wherein the digital adjustment circuit (4) is configured to compensate for non-differential asymmetries around the Larmor frequency in the digital signal by adjusting phase and/or amplitude of the digital signal based on monitored measured values of the signal circuit (Pr2). Furthermore, the invention relates to a method for compensating for non-differential asymmetries around the Larmor frequency in a digital signal in a galvanic transmission line (1) of a radio frequency (RF) coil assembly.

14 Claims, 4 Drawing Sheets

(56) References Cited

U.S. PATENT DOCUMENTS

| | | | | |
|---|---|---|---|---|
| 2009/0121717 | A1 | 5/2009 | Haans et al. | |
| 2024/0154287 | A1* | 5/2024 | Findeklee | G01R 33/36 |

OTHER PUBLICATIONS

Byun et al "Analysis and Improvement of Electromagnetic Susceptibility on High Speed LVDS I/O System" Proceedings of Asia-Pacific Microwave Conference 2010.
Kayano et al "Evaluation of Imbalance Component and EM Radiation Generated by an Asymmetrical Differential Paired Lines Structure" Transactions of the Japan Institute of Electronics Packaging vol. 4, No. 1 2011.
Matig-a et al "An Integrated LVDS Transmitter in 0.18 um CMOS Technology with High Immunity to EMI" IEEE Transactions on Electromagnetic Compatibility vol. 57, No. Feb. 1, 2015.
Tomonari "EMC Countermeastures of Low Voltage Differential Signaling Circuits" 2021.

* cited by examiner a)
1
4
6
10
5
R1
R=50 Ohm
V1
SRC1
G=1.01
T=50ps
V2
U=2.4V
R2
R=50 Ohm
G=1.01
10
G=1.00
Z=50 Ohm
L=114.9896229 mm
Z=50 Ohm
L=100 mm
C2
C=2 pF
C3
C=2 pF
Pr2
Tr1
L1=5 nH
L2=1 nH
k=0.001
Tr2
L1=5 nH
L2=1 nH
k=0.001
Pr1
R3
R=50 Ohm
R4
R=50 Ohm
b)
Pr1 Vt
time
c)
Pr2 Vt
time
d)
imag(eyediag)
real(eyediag)

RADIO FREQUENCY COIL ASSEMBLY WITH SIGNAL ADJUSTMENT CIRCUIT, RELATED METHOD AND COMPUTER PROGRAM PRODUCT

CROSS REFERENCE TO RELATED APPLICATIONS

This application is a U.S. national phase application of International Application No. PCT/EP2023/057374 filed on Mar. 22, 2023, which claims the benefit of EP Application Ser. No. 22/165,733.1 filed on Mar. 31, 2022 and is incorporated herein by reference.

FIELD OF THE INVENTION

The invention relates to the field of radio frequency (RF) coil assemblies for a magnetic resonance (MR) imaging systems, and in particular to an adjustment circuit for a digital signal (e.g. the digitized MR-signal).

BACKGROUND OF THE INVENTION

Galvanic transmission of digital signals in the vicinity of highly sensitive analog electromagnetic receivers poses a major challenge in relation to e.g. magnetic resonance imaging (MRI) because the digital data usually uses a broad spectrum and always radiates through the shielding of the transmission line to some degree. This leakage is significantly increased in case of imperfect transmission lines or terminations for the data signals. A shaping of the signal to reduce that spectral content comes with additional costs.

Typically, a galvanic transmission line 1 for digital signals is using a differential signal. The simplest transmission line for such signals is just a twisted pair cable. Such an unshielded cable, however, radiates by far too much energy and can therefore not be used inside a highly sensitive (round thermal noise level) MRI receiver. A shielded cable 1 has one more galvanic conductor 3, thus with the shielding 2 three in total as shown in FIG. 1. It forms a so-called coupled transmission line, which gets an additional mode for signal propagation. The first two modes are so-called TEM modes (transversal electromagnetic). The differential mode, as shown in FIG. 1*a*) is the most desired one, which should carry the signal to be transmitted. In case of any asymmetry in the excitation, also the second mode is excited. This mode, shown in FIG. 1*b*) is called coax-mode here since the current distribution looks like that of a coaxial cable. In a low voltage differential signaling (LVDS) cable, the two inner conductors 3 just share the same potential in this mode, thus they act together like the inner conductor of a coaxial cable. The third mode, shown in FIG. 1*c*), here called "common" mode is the only one having a net current (sum of all currents does not equal zero). That one is heavily coupling to receive elements and therefore must be avoided. The coax mode, however, typically transfers some of its energy to the common mode just due to cable and connector imperfections. The excitation of the coax mode should therefore be avoided at the transmitter side.

Optical fibers could also be an option to reduce crosstalk. However, they may have some drawbacks. The demanded fiber-optic transceivers (FOTs) are bulky and need a lot of power. They come with a temperature-dependent delay which makes it difficult to recover a clock signal. Furthermore they are expensive.

There is a need for reducing spurious noise to digital data transmission, such as in relation to radio frequency (RF) coil assemblies for MRI.

In document U.S. Pat. No. 9,407,268 B1 a low voltage differential signaling (LVDS) driver is disclosed having an output voltage amplitude regulator for regulating an output voltage amplitude of the LVDS driver by receiving a differential output signal from a switched-polarity current generator of the LVDS driver at an output voltage amplitude regulator of the LVDS driver, detecting an output voltage amplitude of the differential output signal, comparing the output voltage amplitude to a reference voltage at the output voltage amplitude regulator and regulating a steering current of the LVDS driver based upon the comparison between the output voltage amplitude and the reference voltage to regulate an amplitude of the differential output signal at one or more loads of the LVDS driver.

In document U.S. Pat. No. 11,112,470 B1 a magnetic resonance imaging apparatus including a data acquisition circuitry configured to generate magnetic resonance data is disclosed, having a digital encoder connected to receive the magnetic resonance data and configured to digitally encode the magnetic resonance data using an encoding scheme having a spectral null approximately at the Larmor frequency; and an electric data transmission line connected to transmit the digitally encoded magnetic resonance data.

Document US 2009/121717 A1 discloses a radio frequency antenna comprising a resonant pickup circuit arranged to pick up a magnetic resonance signal, an analog-to-digital converter arranged to convert the magnetic resonance signal to digital data, and a frequency converter arranged to convert a primary band of frequencies of the digital data. By upshifting the frequency of the transmitted bit-stream, it is possible to RF-trap the transmission channel by simple high-pass filtering techniques.

SUMMARY OF THE INVENTION

It is an object of the invention to avoid or reduce spurious noise of an RF coil assembly digital signal path.

According to the invention, this object is addressed by the subject matter of the independent claims. Preferred embodiments of the invention are described in the dependent claims. Therefore, according to the invention, a radio frequency (RF) coil assembly for a magnetic resonance (MR) imaging system is foreseen, the assembly comprising: a galvanic transmission line configured to transmit a digital signal via low voltage differential signaling, a signal circuit, configured to monitor non-differential asymmetries around the Larmor frequency in the digital signal through the galvanic transmission line, wherein the signal circuit is configured to provide feedback to a digital adjustment circuit, wherein the digital adjustment circuit is configured to compensate for non-differential asymmetries around the Larmor frequency in the digital signal by adjusting phase and/or amplitude, of the digital signal based on monitored measured values of the signal circuit.

The basic idea of the present invention is to provide a signal delay adjustment circuit, or an amplitude adjustment circuit, or a signal delay and amplitude adjustment circuit, to adjust the symmetry around the Larmor frequency in a galvanic transmission line. Very small asymmetries in the digital signal around the MR frequency can cause large coupling artifacts. By monitoring and correcting phase differences, or amplitude differences, or phase and amplitude differences between the channels of the digital signal in a feedback loop to compensate for such non-differential asymmetries along the signal path, a very symmetric signal may be created around the Larmor frequency. The feedback may comprise complex numbers to account for asymmetries in phase and/or amplitude at a selected frequency around the Larmor frequency. The compensation of asymmetries around the Larmor frequency means that coupling of the digital signal path to elements of the RF coil and thereby introduced noise can be significantly reduced. This may also enable thin and flexible digital cables on the coil assembly, since otherwise thicker shielding would be required.

In an advantageous embodiment of the invention the digital adjustment circuit comprises at least one amplifier, wherein the digital adjustment circuit is configured to adjust the amplitude by changing the bias point of the amplifier.

In another advantageous embodiment of the invention the digital adjustment circuit comprises a programmable delay line for adjusting the phase of the digital signal. By means of a programmable delay line the phase of the digital signal can be easily delayed according to the requirements.

In an advantageous embodiment of the invention the digital adjustment circuit comprises at least one single pole double throw (SPDT) switch for adjusting the phase of the digital signal. By means of an SPDT switch the phase of the digital signal can be changed in a simple way.

In another advantageous embodiment of the invention the digital adjustment circuit comprises a tunable 2-port for adjusting the amplitude and the phase of the digital signal together.

In an advantageous embodiment of the invention the tunable 2-port is a lumped element transmission line. Particularly preferably, it may be provided that the capacitors of lumped element transmission line are realized as digital capacitors, such as switchable capacitors in a binary array to tune the values in a broad range. These two degrees of freedom are sufficient to adjust amplitude and phase at the output.

In another advantageous embodiment of the invention, the digital signal is a digital magnetic resonance (MR) signal. The present invention can be used for any digital data stream to be transmitted in a (narrowband) sensitive environment. In the radio frequency (RF) coil assembly for a magnetic resonance (MR) imaging system, digital data links are located near an MRI receiver. Therefore, in one embodiment of the invention, MR receive signal data is provided to be transmitted over the transmission line and the interference is compensated by means of the invention.

The invention further relates to a magnetic resonance (MR) imaging system comprising a radio frequency (RF) coil assembly as described above.

The invention also relates to a method for compensating for non-differential asymmetries around the Larmor frequency in a digital signal in a galvanic transmission line of a radio frequency (RF) coil assembly for a magnetic resonance (MR) imaging system, the method comprising the following steps:

- providing a radio frequency (RF) coil assembly as described above,
- measuring non-differential asymmetries around the Larmor frequency in a signal through the galvanic transmission line by the signal circuit,
- compensating for non-differential asymmetries around the Larmor frequency in the digital signal by adjusting phase and/or amplitude of the digital signal by the digital adjustment circuit based on monitored measured values of the signal circuit.

In an advantageous embodiment of the invention, the step of compensating for non-differential asymmetries around the Larmor frequency in the digital signal by adjusting phase and/or amplitude of the digital signal by the digital adjustment circuit comprises a step of adjusting the amplitude and the phase together by a tunable 2-port.

In another advantageous embodiment of the invention parameters for the step of compensating for non-differential asymmetries around the Larmor frequency in the digital signal by adjusting phase and amplitude of the digital signal by the digital adjustment circuit are loaded by a remote operator or a control service software to the adjustment circuit.

The invention also relates to a computer program product comprising instructions to cause the radio frequency (RF) coil assembly as described above to execute the steps of the method as described above.

In advantageous embodiment of the invention the computer program product is performed on a neural network.

The invention also relates to the use of a radio frequency (RF) coil assembly according as described above inside a flexible magnetic resonance imaging receive array.

BRIEF DESCRIPTION OF THE DRAWINGS

These and other aspects of the invention will be apparent from and elucidated with reference to the embodiments described hereinafter. Such an embodiment does not necessarily represent the full scope of the invention, however, and reference is made therefore to the claims and herein for interpreting the scope of the invention.

In the drawings.

DETAILED DESCRIPTION OF EMBODIMENTS

Figure 1:
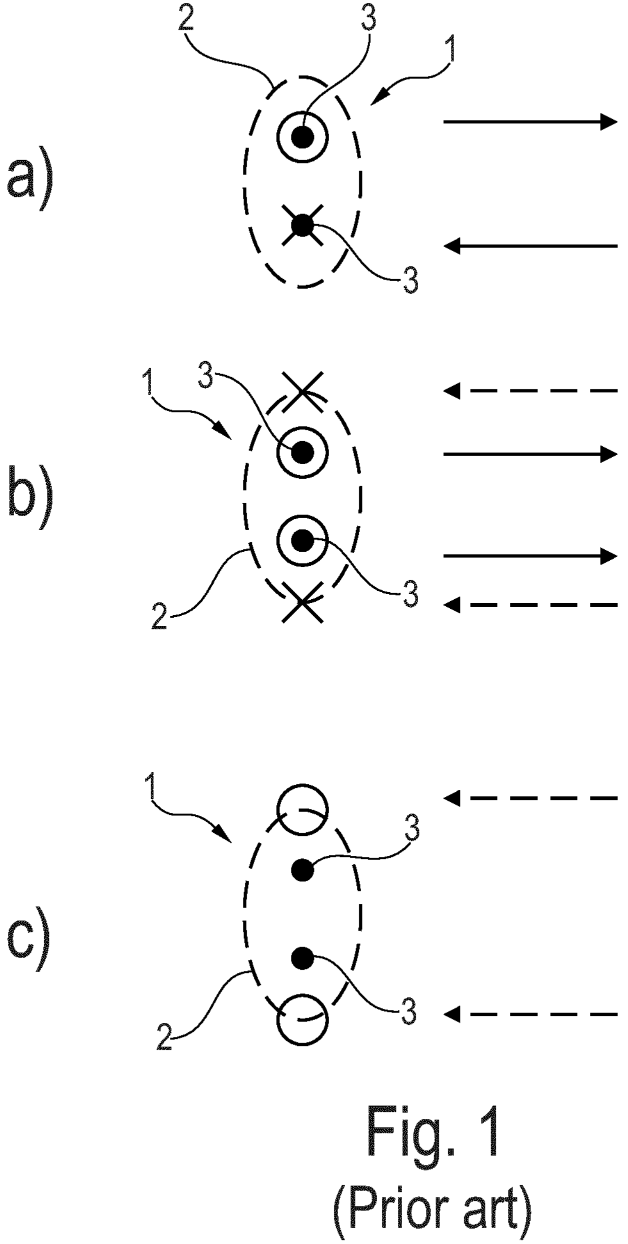
FIG. 1 schematically depicts three different modes inside a shielded LVDS cable according to the state of the art.

FIG. 1 depicts three different modes inside a shielded LVDS cable 1 according to the state of the art and has already been explained in the introductory part of the description.

The simulations presented below represent only embodiments of the present invention. In particular, the galvanic transmission line 1 may be a shielded LVDS cable. The figures described below, as well as the components and sizes of the components shown in the figures, represent only embodiments of the invention and are not restrictive.

Figure 2:
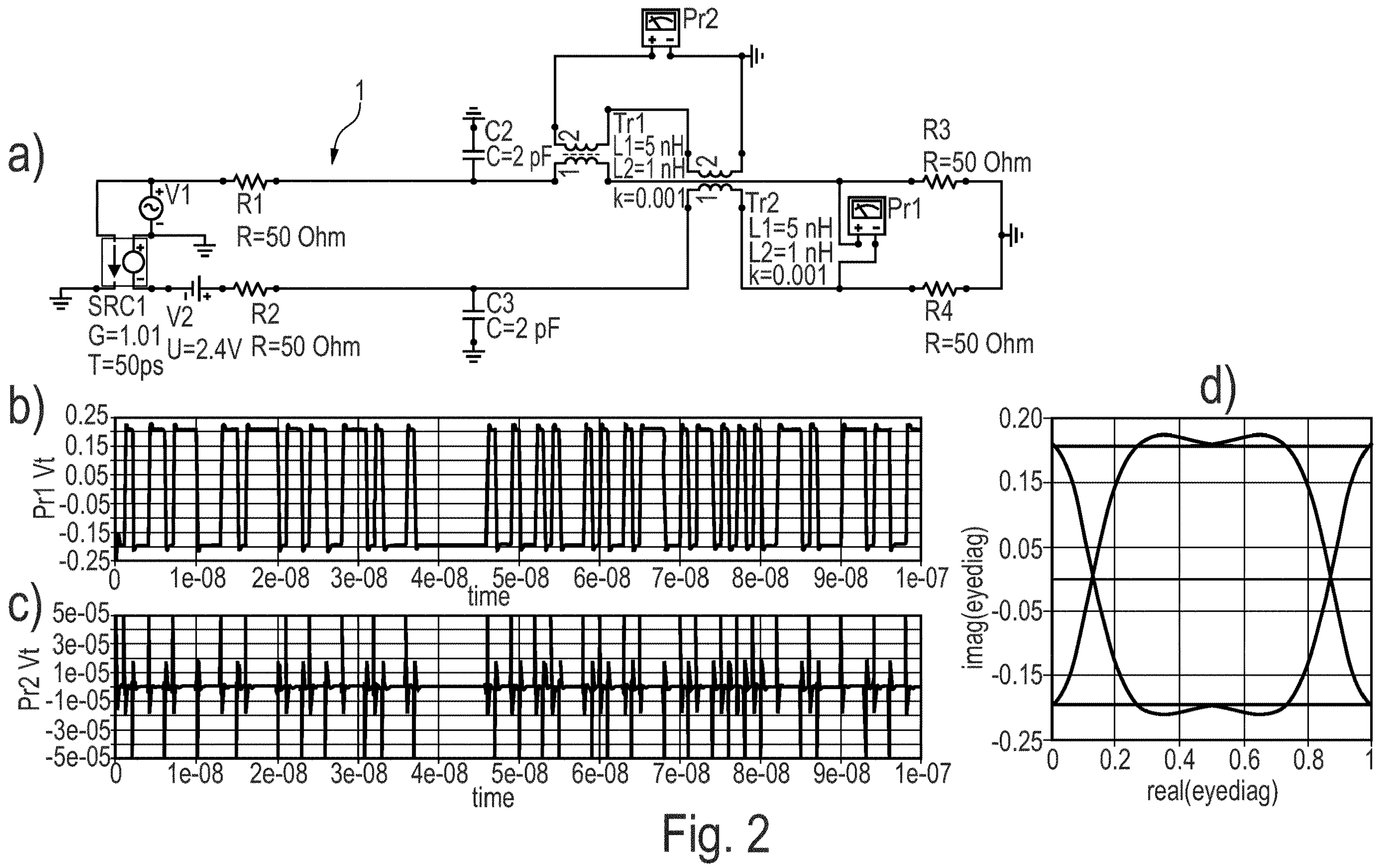
FIG. 2 shows in FIG. 2*a*) a simulated circuit of an imperfect LVDS transmitter and corresponding signals, wherein FIG. 2*b*) shows the received signal at the LVDS receiver, FIG. 2*c*) shows the coupled signal into an MRI receive element and FIG. 2*d*) an eye-diagram showing the quality of the digital transmission.

In FIG. 2*a*) a simulated circuit of an imperfect LVDS transmitter e.g., a voltage dependent voltage source SRC1 and the corresponding signals are shown. FIG. 2*b*) shows the received signal at the LVDS receiver and FIG. 2*c*) shows the coupled signal into an MRI receive element. FIG. 2*d*) shows an eye-diagram showing the quality of the digital transmission. FIG. 2*a*) shows a realistic imperfect LVDS transmitter SRC1. The signal generator is simulated with a 50 ps delay and a 1% increased amplitude for the negative channel. The received (differential) signal is sketched in FIG. 2*b*). FIG. 2*d*) on the right shows the corresponding eye-diagram, which is quite open, thus sufficient for a detector. A small coupling to an MRI receiver coil is modelled with a symmetric inductive coupling. As can be seen in FIG. 2*c*), the induced signal reaches levels around a few 100 mV, thus it is significantly above the thermal noise level defining the sensitivity of that MR receive element. This would make MRI imaging almost impossible due to the additional spurious noise. Furthermore, in FIG. 2*a*) the principle of an LVDS generator SRC1 together with an (ideal) 100 Ohm transmission line 1 and a signal circuit Pr2 is shown. This signal circuit Pr2 e.g., an asymmetry sensing detector can be integrated at both sides of the transmission line. It is potentially more sensitive at the receiving end at the resistors R3 and R4. At the left, the voltage source V1 contains the digital time-dependent signal. The voltage dependent voltage source SRC1 below is dimensioned such that the time-dependent part is always forming the opposite signal (to form a differential signal). The differential signal is received with the probe Pr1 on the right side. It is proposed to not directly terminate the differential signal by a resistor corresponding to the differential mode impedance (here 100Ω) but use twice half of that impedance (here 50Ω) R3, R4 in series and measure the potential of that connection versus ground (or shield of the cable). The simulation assumed already a non-perfect signal with 1% greater amplitude (G=1.01) in the lower connection and comparably small delay of T=50 ps (compared to: period duration MRI 127.7 MHz: 8 ns; signal base band: 1 GHz: 1 ns). This hardly changes the signal, shown in FIG. 2*b*) received by the probe Pr1 since that is almost only sensitive to the differential mode; thus, it can easily be tolerated for the digital signal transmission. However, this tiny imperfection causes significant coupling to the receive elements of an MRI coil. The detector sketched by the signal circuit Pr2 is very sensitive to the common mode, thus, it can well detect these imperfections, as shown in FIG. 2*c*).

Figure 3:
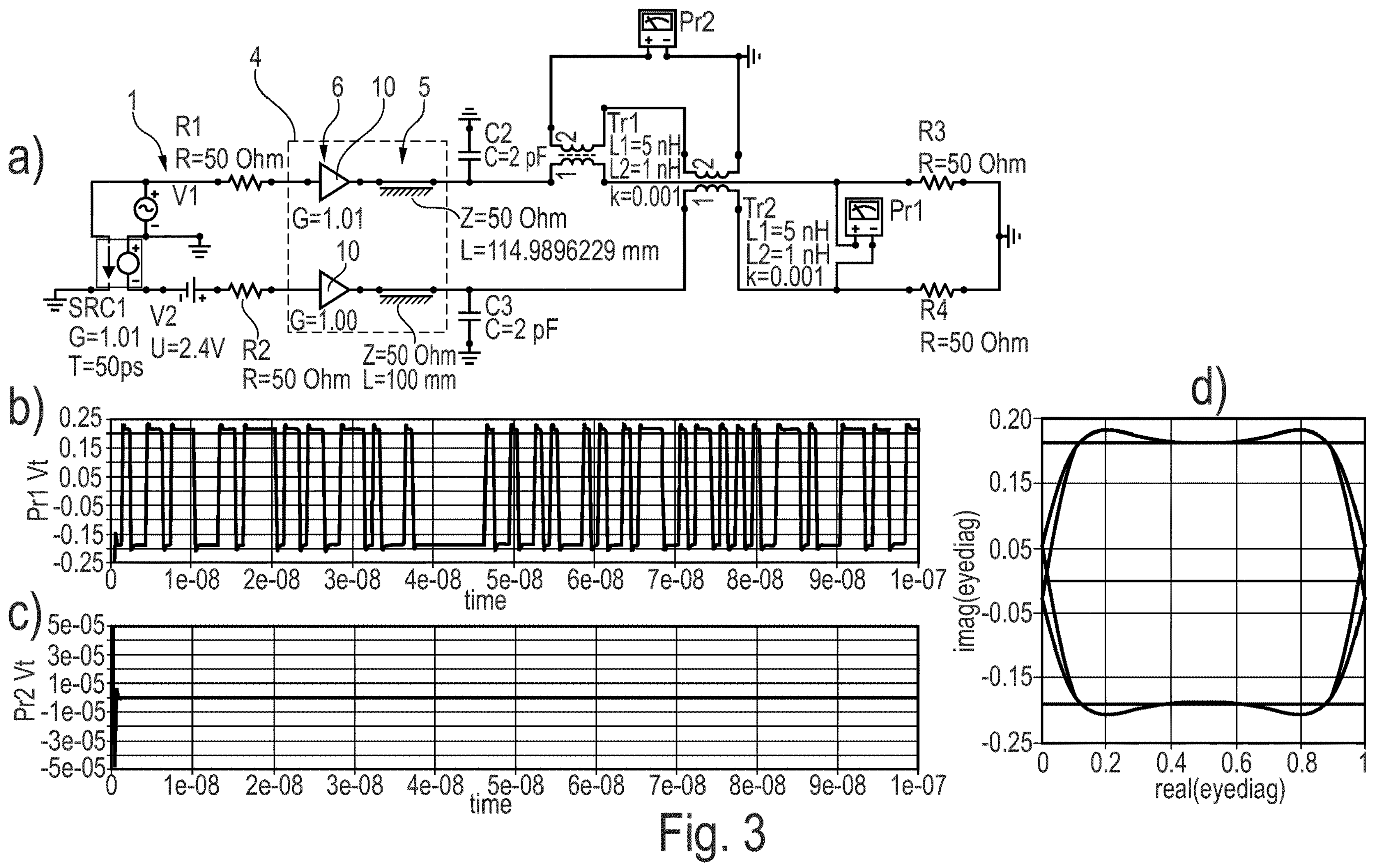
FIG. 3 shows in FIG. 3*a*) a simulated circuit of an imperfect LVDS transmitter with proposed correction circuitry and corresponding signals, wherein FIG. 3*b*) shows the received signal at the LVDS receiver, FIG. 3*c*) shows the coupled signal into an MRI receive element and FIG. 3*d*) an eye-diagram showing the quality of the digital transmission according to an embodiment of the invention.

FIG. 3*a*) shows the proposed mitigation of the imperfect transmitter. By compensating the amplitude difference and the delay of the two channels, the signal becomes highly symmetric which significantly reduces e.g., the coupling into the receive coil element as shown in FIG. 3*c*). A standard LVDS receiver is just sensing the differential signal which contains the data. Small imperfections in the symmetry are not critical for the data transmission, however, they significantly increase noise emitted by an imperfectly shielded transmission line 1. To reduce the interference, a signal circuit Pr2, configured to monitor non-differential asymmetries around the Larmor frequency in a digital signal through the galvanic transmission line 1 and an adjustment circuit 4 are provided to precisely adjust that symmetry which significantly reduces that noise coupling. The detector sketched by the voltage probe Pr2, is the signal circuit for monitoring the non-differential asymmetries. In one embodiment, the digital adjustment circuit shown in FIG. 3*a*) may comprise a phase adjusting circuit 5 and/or an amplitude adjusting circuit 6. The phase adjusting circuit 5 can be a signal delay circuit. With the combination of a combined signal delay and amplitude adjustment circuit 6 the symmetry in an LVDS transmission line 1 can be perfectly or close to perfectly adjusted. In one embodiment the digital adjustment circuit 4 comprises at least one amplifier 10, wherein the digital adjustment circuit 4 is configured to adjust the amplitude by changing the bias point of the amplifier 10. In another embodiment, it may be provided, that the digital adjustment circuit 4 comprises a programmable delay line for adjusting the phase of the digital signal. Single pole double throw (SPDT) switches can also be provided for adjusting the phase. For adjusting the phase and amplitude together, a tunable 2-port can be provided in one embodiment. For example, this tunable 2-port can be a lumped element transmission line 7. Such a lumped element transmission line 7 is described in more detail in FIG. 4. Thanks to the adjustment of in this example phase and amplitude by the digital adjustment circuit 4 shown in FIG. 3*a*), the coupling into neighboring MR receive elements is significantly reduced as shown in FIG. 3*c*).

Figure 4:
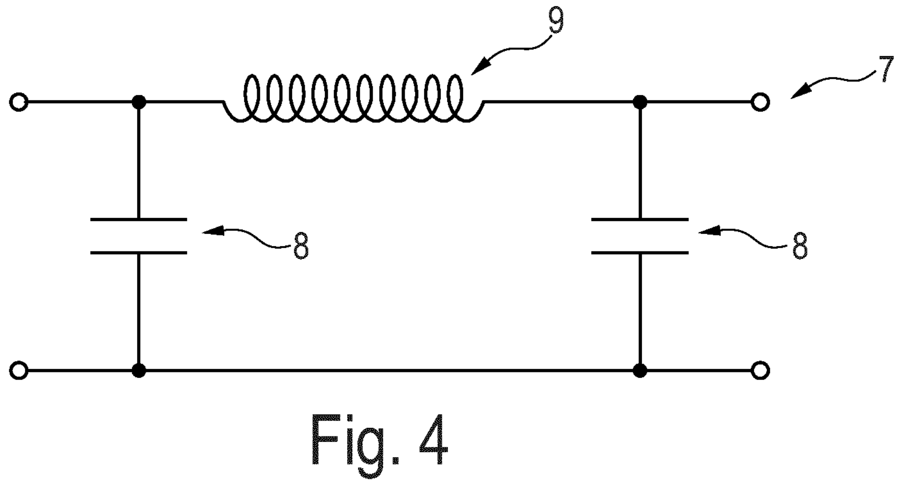
FIG. 4 shows a circuit of a lumped element transmission line which acts as a digital adjustment circuit according to an embodiment of the invention.

FIG. 4 shows a circuit of a lumped element transmission line 7 which acts as a digital adjustment circuit 4 according to an embodiment of the invention. In one embodiment of the invention, it may be provided that the amplitude and the phase are not adjusted separately from each other. For example, a tunable 2-port can be provided for this purpose. FIG. 4 shows a lumped element transmission line 7 as an example of a tunable 2-port consisting of coils and capacitors. In the circuit shown in FIG. 4, the capacitors 8 can be realized as digital capacitors, such switchable capacitors in a binary array to tune the values in a broad range. These two degrees of freedom are sufficient to adjust amplitude and phase at the output. Losses are also tolerable since there is enough signal available.

In a coil array with LVDS cables, the twinax lines may couple to nearby individual coils. The adjustment process is also specified in the form of a method and can be controlled in particular by a computer program product. The method and in particular the computer program product can be based in an embodiment of the invention on a neuronal network to mitigate the noise coupling.

Figure 5:
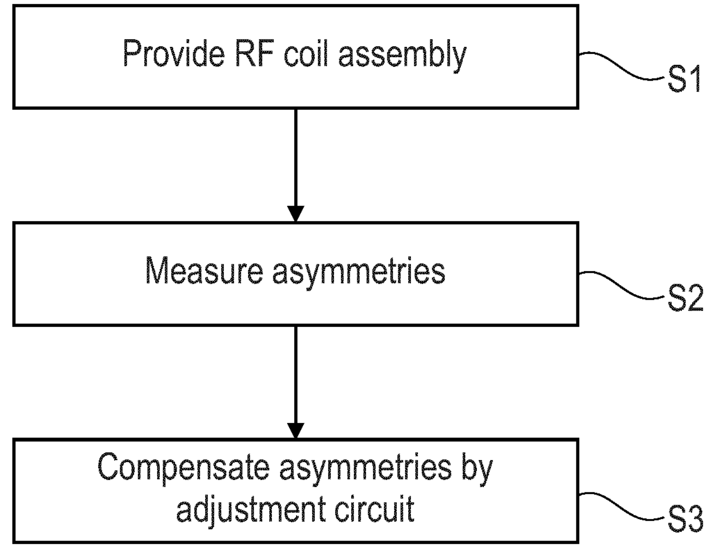
FIG. 5 shows a flowchart of a method for compensating for non-differential asymmetries around the Larmor frequency in a digital signal in a radio frequency (RF) coil assembly according to an embodiment of the invention.

FIG. 5 shows a flowchart of a method for compensating for non-differential asymmetries around the Larmor frequency in a digital signal in a radio frequency (RF) coil assembly according to an embodiment of the invention. The method starts with step S1 by providing a radio frequency (RF) coil assembly wherein the RF coil assembly comprises at least a galvanic transmission line 1 configured to transmit a digital signal, a signal circuit Pr2, configured to monitor non-differential asymmetries around the Larmor frequency in a digital signal through the galvanic transmission line 1, wherein the signal circuit Pr2 is configured to provide feedback to a digital adjustment circuit 4, wherein the digital adjustment circuit 4 is configured to compensate for non-differential asymmetries around the Larmor frequency in the digital signal by adjusting phase and/or amplitude of the digital signal. In step S2 non-differential asymmetries around the Larmor frequency in a signal through the galvanic transmission line 1 are measured by the signal circuit Pr2. In step S3 non-differential asymmetries around the Larmor frequency in the digital signal are compensated by adjusting phase and/or amplitude of the digital signal by the adjustment circuit 4. In an embodiment, parameters for the step of compensating for non-differential asymmetries around the Larmor frequency in the digital signal by adjusting phase and/or amplitude of the digital signal by the digital adjustment circuit 4 are loaded by a remote operator or a control service software to the adjustment circuit. The parameters my also depend on the coil position or geometry or combination with other coils. For the execution of the method a computer program product is provided. The parameters are also included in the computer program product. In advantageous embodiment of the invention the computer program product is performed on a neural network.

Thus, in one embodiment, a method to avoid any common/coax mode excitation from a signal generating circuit by monitoring asymmetries at a frequency and very exact adjustment of amplitude and/or phase of both channels at the same selected frequency, in this case around the Larmor frequency, thus ensuring very high symmetry, is disclosed.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope. Further, for the sake of clearness, not all elements in the drawings may have been supplied with reference signs.

REFERENCE SYMBOL LIST galvanic transmission line 1
shielding 2
conductor 3
digital adjustment circuit 4
phase adjusting circuit 5
amplitude adjusting circuit 6
lumped element transmission line 7
capacitor 8
coil 9
amplifier 10
probe Pr1
signal circuit Pr2
resistor R1
resistor R2
resistor R3
resistor R4
voltage source V1
voltage dependent voltage source SRC1

The invention claimed is:

1. A radio frequency (RF) coil assembly for a magnetic resonance (MR) imaging system, the assembly comprising:

a galvanic transmission line configured to transmit a digital signal via low voltage differential signaling, a signal circuit (Pr2), configured to monitor non-differential asymmetries around the Larmor frequency in the digital signal through the galvanic transmission line, wherein the signal circuit (Pr2) is configured to provide feedback to a digital adjustment circuit, wherein the digital adjustment circuit is configured to compensate for non-differential asymmetries around the Larmor frequency in the digital signal by adjusting phase and/or amplitude of the digital signal based on monitored measured values of the signal circuit (Pr2).

2. The radio frequency (RF) coil assembly according to claim 1, wherein the digital adjustment circuit comprises at least one amplifier, wherein the digital adjustment circuit is configured to adjust the amplitude by changing the bias point of the amplifier.

3. The radio frequency (RF) coil assembly according to claim 1, wherein the digital adjustment circuit comprises a programmable delay line for adjusting the phase of the digital signal.

4. The radio frequency (RF) coil assembly according to claim 1, wherein the digital adjustment circuit comprises at least one single pole double throw (SPDT) switch for adjusting the phase of the digital signal.

5. The radio frequency (RF) coil assembly according to claim 1, wherein the digital adjustment circuit comprises a tunable 2-port for adjusting the amplitude and the phase of the digital signal together.

6. The radio frequency (RF) coil assembly according to claim 5, wherein the tunable 2-port is a lumped element transmission line.

7. The radio frequency (RF) coil assembly according to claim 1, wherein the digital signal is a digital magnetic resonance (MR) signal.

8. A magnetic resonance (MR) imaging system comprising a radio frequency (RF) coil assembly according to claim 1.

9. A method for compensating for non-differential asymmetries around the Larmor frequency in a digital signal in a galvanic transmission line of a radio frequency (RF) coil assembly for a magnetic resonance (MR) imaging system, the method comprising the following steps:

providing a radio frequency (RF) coil assembly according to claim 1, measuring non-differential asymmetries around the Larmor frequency in a signal through the galvanic transmission line by the signal circuit (Pr2), compensating for non-differential asymmetries around the Larmor frequency in the digital signal by adjusting phase and/or amplitude of the digital signal by the digital adjustment circuit based on monitored measured values of the signal circuit (Pr2).

10. The method according to claim 9, wherein the step of compensating for non-differential asymmetries around the Larmor frequency in the digital signal by adjusting phase and/or amplitude of the digital signal by the digital adjustment circuit comprises a step of adjusting the amplitude and the phase together by a tunable 2-port.

11. The method according to claim 10, wherein parameters for the step of compensating for non-differential asymmetries around the Larmor frequency in the digital signal by adjusting phase and amplitude of the digital signal by the digital adjustment circuit are loaded by a remote operator or a control service software to the adjustment circuit.

12. A computer program product comprising instructions to cause a radio frequency (RF) coil assembly of claim 1 to execute a method comprising:

measuring non-differential asymmetries around the Larmor frequency in a signal through the galvanic transmission line by the signal circuit (Pr2), and compensating for non-differential asymmetries around the Larmor frequency in the digital signal by adjusting phase and/or amplitude of the digital signal by the digital adjustment circuit based on monitored measured values of the signal circuit (Pr2).

13. The computer program product according to claim 12, wherein the computer program product is performed on a neural network.

14. Use of a radio frequency (RF) coil assembly according to claim 1 inside a flexible magnetic resonance imaging receive array.

* * * * *